United States Patent [19]
Wenzig et al.
[11] 3,903,591
[45] Sept. 9, 1975

[54] SEMICONDUCTOR ARRANGEMENT

[75] Inventors: Wolfgang Wenzig; Werner Spaeth, both of Munich, Germany

[73] Assignee: Siemens Aktiengesellschaft, Berlin, Germany

[22] Filed: Oct. 5, 1973

[21] Appl. No.: 403,916

Related U.S. Application Data

[62] Division of Ser. No. 287,709, Sept. 11, 1972, abandoned.

[30] Foreign Application Priority Data

Sept. 22, 1971 Germany ........................ 2147338

[52] U.S. Cl. .................... 29/578; 29/583; 357/52
[51] Int. Cl. ........................................ B01j 17/00
[58] Field of Search ......... 29/578, 580, 583; 357/52

[56] References Cited

UNITED STATES PATENTS

| | | | |
|---|---|---|---|
| 3,247,428 | 4/1966 | Perri | 29/578 |
| 3,497,407 | 2/1970 | Esch | 29/578 |
| 3,518,750 | 7/1970 | Moyle | 29/578 |

*Primary Examiner*—W. Tupman
*Attorney, Agent, or Firm*—Hill, Gross, Simpson, Van Santen, Steadman, Chiara & Simpson

[57] ABSTRACT

A semiconductor arrangement has an insulating protective layer composed of two sub-layers with a contacting window in the insulating layer, the outer sub-layer consisting, e.g. of $Si_3N_4$ in the contact window is conducted over the edge of the inner sub-layer consisting of $SiO_2$, up to the semiconductor surface within the window, so that the $SiO_2$ layer is screened from the contacting electrode and the alien ions (Na-ions) usually contained therein.

3 Claims, 3 Drawing Figures

SEMICONDUCTOR ARRANGEMENT

This is a division, of application Ser. No. 287,709, filed Sept. 11, 1972 now abandoned.

BACKGROUND OF THE INVENTION

1. Field of the Invention

The present invention relates to semiconductor arrangements and more particularly to semiconductor arrangements comprising a semiconductor crystal in which at least one p-n junction meets a surface of the semiconductor crystal along a closed curve, and an electrically insulating protective layer covering the p-n junction on the semiconductor surface, a window being formed in the protective layer to accommodate an electrode contacting the electrode surface within the closed curve along which the p-n junction meets the surface of the crystal.

2. Description of the Prior Art

The semiconductor arrangements produced by the planar technique are usually, even during the production process, covered with an electrically insulating protective layer consisting of silicon dioxide. In addition, alumina $Al_2O_3$ and silicon nitride $Si_3N_4$ are employed as protective layer materials. Protective layers of this kind can also, however, be applied as a protective coating of an already completed semiconductor arrangement, after the termination of the actual production process, even where a protective layer has already been used as a diffusion mask and is still present.

SUMMARY OF THE INVENTION

According to the present invention, there is provided a semiconductor arrangement comprising a semiconductor crystal having a p-n junction the intersection of which with a surface of the crystal follows a closed path, an electrically insulating protective layer covering the intersection of the p-n junction with the surface and consisting of at least two sub-layers, an inner sub-layer consisting of silicon dioxide in contact with the crystal surface, and an outer sub-layer or layers consisting of an electrically insulating oxide of a trivalent metal of Group III of the Periodic System of the elements and/or of beryllium oxide and/or of silicon nitride. A window is formed in said protective layer within the closed path formed by the intersection of the p-n junction with the surface, and an electrode in contact with the surface of the crystal within the window and spaced from the periphery thereof. The outer sub-layer or sub-layers extending over the edge of the inner sub-layer at the periphery of the window and over and in contact with the surface of the crystal in the gap between the periphery of the window and the periphery of the electrode.

In this way it is ensured that alien ions, in particular sodium ions, which would to a large extent diffuse through the $SiO_2$ of the inner sub-layer to the p-n junction, are prevented from penetrating into this sub-layer. The outer sub-layer is substantially impermeable to alien ions of this kind, provided that it consists of one of the above-mentioned materials. On the other hand, however, the p-n junction is in direct contact with a part of the protective layer which is favorable with respect to its electrical properties and which consists of $SiO_2$.

As previously stated, the outer protective sub-layer or layers may consist of an oxide of a trivalent metal of the Group III of the Periodic System, and/or of BeO and/or of $Si_3N_4$. Layers of these materials are electrically insulating and have adequate mechanical and damp resistance. Suitable oxides include $Al_2O_3$, $Sc_2O_3$, $La_2O_3$ and the oxides of the so-called ytterbia. However, because of the favorable influence of its electric properties on the semiconductor surface at the p-n junction, the inner protective layer consists of $SiO_2$ which may either be obtained pyrolytically from an appropriate reaction gas, or by thermal oxidation of the crystal surface when the semiconductor crystal consists of silicon.

The presence of an outer sub-layer on the insulating protective layer appreciably improves the electrical stability and also the resistance to aging of the electrical properties of the semiconductor arrangement, provided that the outer sub-layer consists of one of the materials mentioned above and is used in accordance with the invention.

In accordance with a further feature of the invention, the outer edge of the inner sub-layer may also be covered by the outer sub-layer or layers, and this sub-layer or layers extend over a narrow zone of the surface of the crystal adjacent this outer edge.

By the use of a composite protective layer on the surface of a semiconductor arrangement, according to the invention, the electrical properties of the arrangement remain constant for a much longer time than if only an $SiO_2$ layer were used as the protective layer, or if the $SiO_2$ protective layer was in fact covered with a second sub-layer, for example, $Si_3N_4$, but the edge of the $SiO_2$ layer facing towards the electrode in the contacting window was not covered by this second sub-layer because the alien atoms, which mainly move over the $SiO_2$ sub-layer and along the peripheral area of this $SiO_2$ sub-layer, are prevented by the outer sub-layer, consisting of one of the above-mentioned materials, from penetrating into the $SiO_2$ sub-layer and from advancing to the critical parts of the p-n junction. In order to achieve this, it is sufficient if the outer sub-layer has a thickness of only 1000 A, and the zone of the direct contact between the outer sub-layer and the semiconductor surface has a width of the same order of magnitude. The constancy of the electrical properties which is obtained is at least 100 times better if the protective layer is provided in accordance with the invention.

In order to produce a semiconductor arrangement in accordance with the invention, after the production of the p-n junction and the $SiO_2$ sub-layer of the insulating protective layer, and also of at least one window penetrating to the semiconductor surface in this inner sub-layer within the closed path produced by the intersection of the p-n junction at the surface, the entire surface of the arrangement is coated with the outer sub-layer, and the material of the outer sub-layer is thereafter removed again within at least one of the windows in the inner sub-layer only to such an extent that in the center of the window the semiconductor surface is exposed, but the edge of the inner sub-layer still remains completely covered by the outer sub-layer. The outer sub-layer extends over a narrow zone within the periphery of the window, and finally, an electrode which contacts the semiconductor surface is applied to the semiconductor surface exposed within the window.

If it is possible to produce the inner sub-layer of the insulating protective layer, i.e. of the $SiO_2$ sub-layer by thermal oxidation of the semiconductor surface, this method is preferred. This is the case when the semiconductor crystal of the arrangement consists of silicon or of silicon carbide. Otherwise, it is possible to produce the $SiO_2$ sub-layer using a known reaction gas. One possibility in this case consists in the thermal decomposition of a pure, gaseous, di-or trisiloxane, which is caused to react on the heated semiconductor surface in the diluted state (the dilutent being, for example, argon). A further simple possibility consists in the oxidation of gaseous $SiH_4$ which, similarly diluted with argon, is applied to the heated surface of the semiconductor crystal together with oxygen, for example in the form of air. This $SiO_2$ sub-layer, if it is to be used as a diffusion mask, advantageously has a thickness of 0.1 to 2 $\mu$m.

If the $SiO_2$ sub-layer is to be used as a diffusion mask, then, as is conventional in the planar technique, at least one window is etched into this $SiO_2$ layer in order to obtain a predetermined localization of the p-n junction or junctions. This etching is effected with the aid of a photolacquer mask as an etching mask, which etching mask is produced in known manner by the application of a photo-lacquer layer, its exposure at predetermined areas and its subsequent development. The developed layer forms the etching mask and dilute hydrofluorix acid is used as an etching agent, which is caused to react on the parts of the $SiO_2$ layer which are exposed at the windows in the photo-lacquer layer.

Even when the $SiO_2$ sub-layer of the insulating protective layer is not to be used as a diffusion mask, the $SiO_2$ must be locally etched away, again using a photolacquer mask as an etching mask and dilute HF as an etching agent, in order to expose the areas at which the semiconductor surface is to be contacted in a predetermined fashion. If the $SiO_2$ layer was used as a diffusion mask, and if the doping substance which was diffused in was used in the form of an oxide on a semiconductor crystal consisting of silicon, $SiO_2$ newly formed at the diffusion windows must be removed again in a predetermined manner. This can likewise be effected using a photo-lacquer mask. In this case, however, if the whole of the newly formed $SiO_2$ is to be removed from the diffusion windows, a photo-lacquer mask can be dispensed with; one merely makes use of the fact that the $SiO_2$ layer in the windows is considerably thinner than the $SiO_2$ of the mask, so that a brief overall etching with dilute aqueous HF solution, possibly buffered with $NH_4$ F, is sufficient to free the semiconductor surface from $SiO_2$ in the diffusion windows without substantially reducing the thickness of the $SiO_2$ layer elsewhere.

For the deposition of the second sub-layer, an appropriate known reaction gas may similarly be caused to react at the surface of the heated crystal. The second sub-layer can, for example, have a thickness of 1000 to 1500 A. As a reaction gas for the production of an $Al_2O_3$ layer, for example, trimethyl-aluminum, diluted with an inert gas may be used, which, in the presence of $O_2$, is brought to act upon the surface of the crystal which is heated to 400° to 500°C. Analogous compounds may be used for the reaction gas, if the outer sub-layer is to consist of $Sc_2O_3$ or $Y_2O_3$ or $La_2O_3$, or another suitable oxide of the ytterbia series. An outer protective layer of BeO may be obtained, for example, by the pyrolytic decomposition of beryllium formate (Be($CHO_2$)$_2$) which may likewise previously be diluted with an inert gas. For the production of a protective layer consisting of $Si_3N_4$, a mixture of $SiH_4$, $NH_3$ and Ar or likewise hydrogen, can be allowed to react with the heated surface of the crystal at a temperature of between 800° and 900°C.

The second sub-layer is deposited over the entire surface. In order now to produce a protective layer in accordance with the invention, the outer sub-layer must be locally removed again in such a manner that the inner sub-layer remains covered. For this purpose, a photo-lacquer mask is again required, the openings of which correspond to windows in the $SiO_2$ sub-layer. They are, however, somewhat smaller and formed in such manner that when this photo-lacquer mask is used as etching mask, the $SiO_2$ sub-layer is nowhere exposed. As etching agents, either hot phosphoric acid or dilute hydrofluoric acid can be used. The photolacquer mask, when hot phosphoric acid is used, must be rendered resistant to this etching agent by a short period of heating to at least 100°C.

The application of the electrode or electrodes is effected in known manner, contact metal being applied to the crystal surface and alloyed or sintered-in at least at the contact areas of the semiconductor surface which are exposed through the outer subsidiary layer. For this, a third mask is required either as a delimiting mask for the localized application of the contact metal by vapor deposition or electrodeposition, or as an etching mask for the predetermined removal of contact metal from areas where it is not required. If a plurality of semiconductor elements in accordance with the invention are simultaneously to be produced in a single semiconductor wafer, obviously one requires as many diffusion masks as there are individual elements to include p-n junctions arranged one within another. On the other hand, it is desirable if the semiconductor surface is freed of every protective layer at the intended lines of division before division is carried out, particularly if the division is to take place by the engraving of straight scratch marks on the crystals surface and breaking along these scratch marks. In this case, it is also advantageous if the doping of the semiconductor at the dividing points is not greater than that of the original wafer, so that the lines of intended division are covered by the diffusion mask during the diffusion process. (It has in fact been found that, for example, the engraving and breaking of the semiconductor wafer is rendered considerably more difficult by additional doping, particularly where silicon wafers doped with phosphorus are concerned into which boron is additionally diffused in the lines of division). Finally the protective layer on all elements which are obtained by the division of the semiconductor wafer, should satisfy the requirements of the invention.

It is desirable that the need for an additional photolacquer mask for this purpose, as was previously required for the production of the p-n junctions of the individual elements, should be avoided.

This may be achieved by making use of a process for the simultaneous production of a plurality of semiconductor elements, which are identical with one another, from a single semiconductor wafer, in which the diffusion mask which serves for the production of the or one of the p-n junctions, in particular the last p-n junction, of the individual semiconductor elements, and which simultaneously forms the starting layer for the production of the inner sub-layer of the insulating protective layer of each semiconductor element which is to be produced, is additionally provided with an auxiliary window which is spaced from and surrounds the actual diffusion window as an annulus or frame, in such manner that no p-n junction intersects that part of the semiconductor surface which is exposed in the auxiliary window, and the inner edge of the auxiliary window encloses and is spaced from all the p-n junctions of the relevant semiconductor element, and that, moreover, no auxiliary window is connected to another of the auxiliary windows; in which one of the p-n junctions of the semiconductor elements is produced with the aid of this diffusion mask; in which the contacting areas of the semiconductor surface and the semiconductor surface within the auxiliary windows are exposed and the outer sub-layer of the insulating protective layer is applied over the entire surface; in which the outer sub-layer of the insulating protective layer is removed at the contacting areas of the semiconductor surface and both sub-layers are removed in the regions between adjacent auxiliary windows, in such a manner that the inner sub-layer is nowhere exposed; in which the contact areas of the semiconductor surface are contacted; and in which, finally, the semiconductor wafer is divided into individual semiconductor elements at dividing lines extending exclusively between the regions formerly occupied by adjacent auxiliary windows.

BRIEF DESCRIPTION OF THE DRAWING

Other objects, featues and advantages of the invention, its organization, construction and operation will be best understood from the following detailed description of preferred embodiments thereof taken in conjunction with the accompanying drawings on which.

DESCRIPTION OF THE PREFERRED EMBODIMENTS

Figures 1, 2, 3:
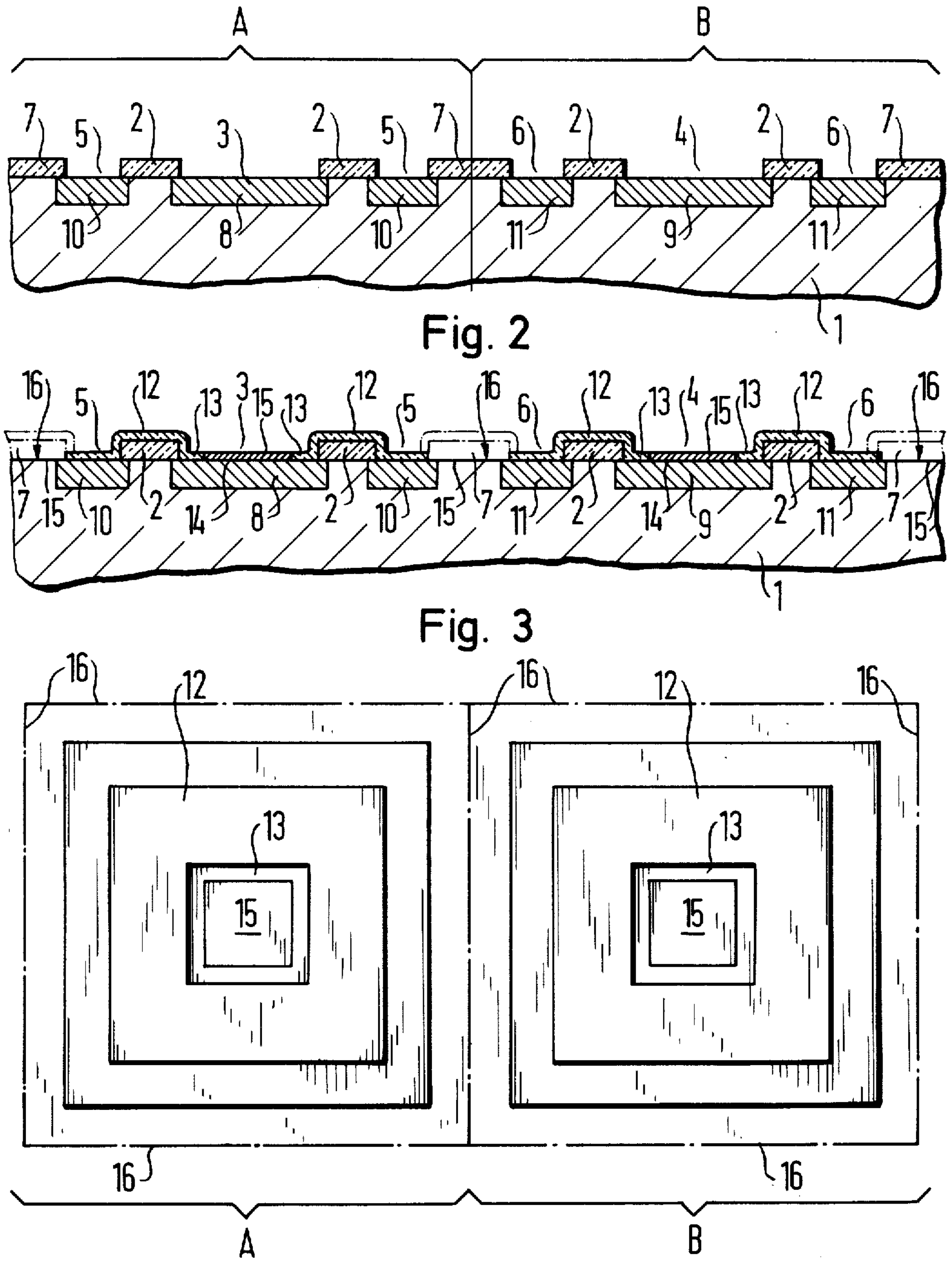
FIGS. 1 and 2 are similar schematic side sectional views, of part of a semiconductor wafer to illustrate two successive steps in the manufacture of a plurality of identical planar diodes according to the invention.
FIG. 3 is a plan view of the wafer part of FIG. 2.

In the drawing, two diodes A and B only are shown. Over the entire wafer, however, the semiconductor components will be arranged spaced apart from one another in rows and columns forming an orthogonal matrix, in such a manner that the semiconductor components could be brought into register with one another by translation only (i.e. without rotation), and that between adjacent rows and columns of this whole arrangement, there in each case remains a sufficiently wide, rectilinear strip outside auxiliary windows which are assigned to the individual semiconductor components and which individually surround the latter at a distance to permit the division of the wafer by cutting or breaking without danger to the components.

Referring to the drawing, a semiconductor wafer 1 which consists, for example, of n-conducting monocrystalline silicon, is first covered with an $SiO_2$ layer 2 which forms the starting point for the production of a diffusion mask and for the inner sub-layer of an insulating protective layer. Such a diffusion mask is required for the production of p-n junctions 8 and 9 belonging respectively to the individual diodes A and B. In order to produce this mask, a photo-lacquer etching mask is required. This etching mask is formed in known manner by means of the known photoresist technique in such a way that, in addition to diffusion windows 3 and 4 which serve for the production of the p-n junctions 8 and 9, the $SiO_2$ layer 2 is provided with ring-shaped or frame-shaped auxiliary windows 5 and 6, respectively, each of which surrounds a respective diffusion window and extends through the layer 2 to the silicon surface. A strip 7 of the semiconductor surface between the auxiliary windows 5 and 6 remains covered by the layer 2.

The arrangement prepared in this way is heated, for example, in an oxidizing atmosphere containing $B_2O_3$ vapor, to produce $p^+$-zones having p-n junctions 8 and 9 in the basic material of the semiconductor crystal. At the diffusion windows 3 and 4 there is thus respectively formed p-n junctions 8 and 9 each of which is in the form of a trough inlet into the silicon surface; these junctions form the p-n junctions of the individual diodes A and B. Because of the presence of the auxiliary windows 5 and 6, however, further $p^+$-zones are produced at the same time, each of these zones surrounding and being spaced from one of the zones 8 and 9 of the diodes A and B, so that therefore each individual arrangement is provided with an additional p-n junction, 10 or 11, which does not participate in the action of the component.

These additional $p^+$-zones can be used as protective rings. It is also possible to transfer other electrical functions to these zones and to the p-n junctions 10, 11 which delimit them from the basic material of the crystal, particularly when these closed p-n junctions 10 and 11 which resemble grooves surrounding the p-n junctions 8 and 9, respectively, are arranged at such a small distance from these p-n junctions that an electrical influence, for example, by minority charge carrier injection, can take place. If these $p^+$-zones are contacted, it must be ensured that the electrodes nowhere contact the inner sub-layer 2. Moreover, care must be taken that when the surface strips 7 are exposed between the auxiliary windows 5 and 6, the outer edge of the p-n junctions 10 and 11 is covered, at least by the outer sub-layer 12 of the insulating protective layer which is subsequently applied.

In general, however, the p-n junctions 10 and 11 which have been formed at the auxiliary windows 5 and 6 will not be used commercially, and protective rings and other ring-shaped or frame-shaped p-n junctions, if they are to participate in the electrical function of the individual semi-conductor components, will be arranged within the semiconductor regions surrounded by the p-n junctions 10 and 11.

The state of the arrangement which is represented in FIG. 1 occurs immediately after the diffusion process which leads to the formation of the p-n junctions 8, 9, 10 and 11 has been effected, and after the removal of any films of silicon dioxide which may possibly have been newly formed (and which contain a large amount of doping substance) on the silicon surface in the windows 3, 4, 5 and 6. The surface of the arrangement is now coated with an outer sub-layer 12, which is then removed again at the areas 14 at which contacting of the zones 8 and 9 is to be effected, within the former diffusion windows 3 and 4. Both of the sub-layers 2 and 12 forming the protective layer are removed at the regions 7 of the semiconductor surface. For this purpose, an appropriately designed further photo-lacquer etching mask is required which is formed in such a way that it covers the entire surface of the arrangement, with the exception of the intended contacting windows and the regions 7 between the adjacent auxiliary windows 5 and 6. The contacting windows are always made smaller than the diffusion windows within which they lie, so that in each case a strip 13, consisting of material of the sub-layer 12 remains around the contacting areas 14 on the silicon surface.

If the outer sub-layer 12 consists, for example, of $Si_3N_4$ deposited at 800°C, or at even higher temperatures, from the reaction gases conventionally used for this purpose, hot phosphoric acid can, for example, be used as the etching agent. Here too, a photo-lacquer mask produced in the usual manner can be used as an etching mask after it has been tempered for some length of time at above 100°C. As a result of the treatment, the silicon surface is exposed at the contact areas 14, and the $SiO_2$ sub-layer which covers the areas 7 is exposed. A subsequent treatment with dilute HF also removes the $SiO_2$ layer at the area 7 of the semiconductor surface. If the outer sub-layer consists of one or more of the aforementioned metal oxides, etching with dilute HF can be used for the production of the contact windows and the removal of both protective layers at the areas 7 between the auxiliary windows.

The exposed contact areas are also provided with electrodes in a conventional manner before the semiconductor wafer 1 is divided up into the individual diodes A and B. This may be effected, for example, by means of a suitable mask, which is used either as a delimiting mask for localized application of the contact metal 15, or as a delimiting mask for the localized removal of contact metal applied in excess. The division of the wafer 1 into the individual elements A and B is finally effected by engraving rectilinear lines 16 in the exposed strips 7 between the former auxiliary windows 5 and 6 of the semiconductor surface, and thereafter breaking up the wafer 1 into the individual elements A and B along the lines 16. In FIGS. 2 and 3 the state of the arrangement immediately before division is shown. Instead of completely removing the two sub-layers of the insulating protective layer at the point 7 as described above, it is also sufficient to free only a narrow strip within the strip 7 from both insulating sub-layers, the lines 16 then running in these narrow strips.

If more complex semiconductor elements then the semiconductor diodes represented in the drawing are to be produced, one of the diffusion masks will also be provided with the additional frame-shaped or ring-shaped auxiliary windows, which annularly surround the actual zone of the individual elements. In any case, it is advisable in this case also, to provide the auxiliary windows in the diffusion mask which serves for the production of the last p-n junction of the individual elements.

In the contacting of the semiconductor zones lying between the individual p-n junctions, corresponding contacting windows must already be provided in the $SiO_2$ sub-layer before the second sub-layer is deposited.

Although we have described our invention by reference to specific illustrative examples, many changes and modifications of the invention may become apparent to those skilled in the art without departing from the spirit and scope of the invention. We therefore intend to include within the patent warranted hereon all such changes and modifications as may reasonaly and properly be included within the scope of our contribution to the art.

We claim:

1. A process for the production of a plurality of identical semiconductor components in a single semiconductor wafer, comprising the steps of: applying a layer of $SiO_2$ on a surface of the wafer, the layer of $SiO_2$ becoming a sub-layer of an insulating protective layer for each individual semiconductor component; forming a plurality of contact windows in the $SiO_2$ layer and a frame-shaped auxiliary window surrounding each contact window; diffusing p-n junctions into the semiconductor wafer through the contact windows, the windows in the diffusion mask being dimensioned and spaced such that none of the p-n junctions opens into the parts of the semiconductor surface which are exposed in the auxiliary windows; covering the $SiO_2$ sub-layer including the side edges which form said contact and auxiliary windows with a continuous outer sub-layer of an insulating protective layer consisting of an insulating material selected from the group consisting of $Si_3N_4$, BeO, and an oxide of a trivalent metal of Group III of the periodic system; removing the outer protective layer in areas of the contact windows to expose the surface of the wafer while maintaining complete coverage of the $SiO_2$ sub-layer; and forming a metal contact to the exposed wafer portion plus separating the individual components from each other along lines of division which extend exclusively within the areas between adjacent auxiliary windows.

2. The process according to claim 1 wherein the step of etching the auxiliary windows occurs prior to the diffusion step.

3. The method according to claim 1, wherein the step of separating the individual semiconductor components from each other is further detailed by the steps of engraving lines in the semiconductor arrangement within the areas between adjacent auxiliary windows and breaking the arrangement along these lines.

* * * * *